United States Patent
Tekleab et al.

(10) Patent No.: US 10,002,895 B2
(45) Date of Patent: Jun. 19, 2018

(54) APPARATUS AND METHODS FOR BURIED CHANNEL TRANSFER GATE

(71) Applicant: SEMICONDUCTOR COMPONENTS INDUSTRIES, LLC, Phoenix, AZ (US)

(72) Inventors: Daniel Tekleab, Hayward, CA (US); Muhammad Maksudur Rahman, San Jose, CA (US); Eric Gordon Stevens, Webster, NY (US); Bartosz Piotr Banachowicz, San Jose, CA (US); Robert Michael Guidash, Rochester, NY (US); Vladimir Korobov, San Mateo, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/294,191

(22) Filed: Oct. 14, 2016

(65) Prior Publication Data
US 2017/0358617 A1 Dec. 14, 2017

Related U.S. Application Data

(60) Provisional application No. 62/349,545, filed on Jun. 13, 2016.

(51) Int. Cl.
*H01L 21/00* (2006.01)
*H01L 27/146* (2006.01)
(Continued)

(52) U.S. Cl.
CPC .... *H01L 27/14614* (2013.01); *H01L 27/1461* (2013.01); *H01L 27/14654* (2013.01);
(Continued)

(58) Field of Classification Search
CPC ......... H01L 27/14614; H01L 27/14654; H01L 27/1461
See application file for complete search history.

(56) References Cited

U.S. PATENT DOCUMENTS 7,446,812 B2 11/2008 Ando et al.
9,729,810 B2 * 8/2017 Lahav ................ H04N 5/37452
(Continued)

OTHER PUBLICATIONS

Ailuri et al., "Correlation of Photo-Response Blooming Metrics with Image Quality in CMOS Image Sensors for Mobile Photography." In Society for Imaging Science and Technology International Symposium on Electronic Imaging 2016 Image Quality and System Performance XIII. 2016.

*Primary Examiner* — Laura Menz
(74) *Attorney, Agent, or Firm* — Treyz Law Group, P.C.; Zachary D. Hadd

(57) ABSTRACT

An image sensor pixel may include a photodiode, a floating diffusion, and a transfer gate. A buried channel may be formed under the transfer gate. The buried channel may extend from the floating diffusion to overlap a portion of the transfer gate without extending completely beneath the transfer gate or reaching the photodiode. The buried channel may provide a path for antiblooming current from the photodiode to reach the floating diffusion, while allowing for the transfer gate off voltage to remain high enough to prevent transfer gate dark current from flowing into the photodiode.

10 Claims, 10 Drawing Sheets

(51) Int. Cl.
  *H01L 29/10* (2006.01)
  *H04N 5/361* (2011.01)
  *H04N 5/378* (2011.01)

(52) U.S. Cl.
  CPC .......... *H01L 29/1033* (2013.01); *H04N 5/361* (2013.01); *H04N 5/378* (2013.01)

(56) References Cited

U.S. PATENT DOCUMENTS

2007/0207599 A1    9/2007  Shin
2013/0092982 A1    4/2013  Chen et al.
2014/0103410 A1*   4/2014  Chen ................. H01L 27/14609
                                                    257/292

* cited by examiner

APPARATUS AND METHODS FOR BURIED CHANNEL TRANSFER GATE

This application claims the benefit of and claims priority to U.S. Provisional Patent Application No. 62/349,545, filed Jun. 13, 2016, which is hereby incorporated by reference herein in its entirety.

BACKGROUND

This relates generally to imaging devices, and more particularly, to imaging devices having pixels with buried channel transfer gates.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode (or other type of photodetector) for generating charge in response to light (e.g., by photoelectric conversion). Circuitry is commonly coupled to each pixel column for reading out image signals from the image pixels.

In certain applications, a photodiode may become filled with electrons (charge), and excess generated electrons may "spill" or migrate into a neighboring photodiode. These excess electrons, which may be referred to as blooming current or charge, may result when the image sensor is exposed to bright light. In these scenarios, blooming current can create various undesirable artifacts in a resulting image.

It would therefore be desirable to provide imaging systems with improved antiblooming control.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
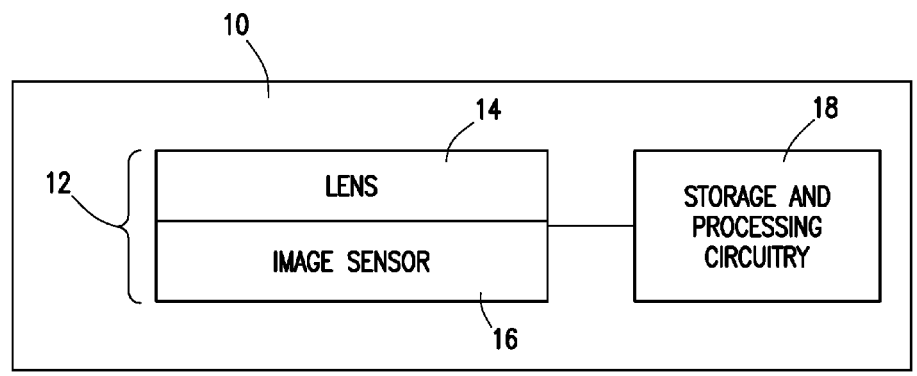
FIG. 1 is a diagram of an illustrative electronic device having an image sensor and processing circuitry for capturing images using a pixel array in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
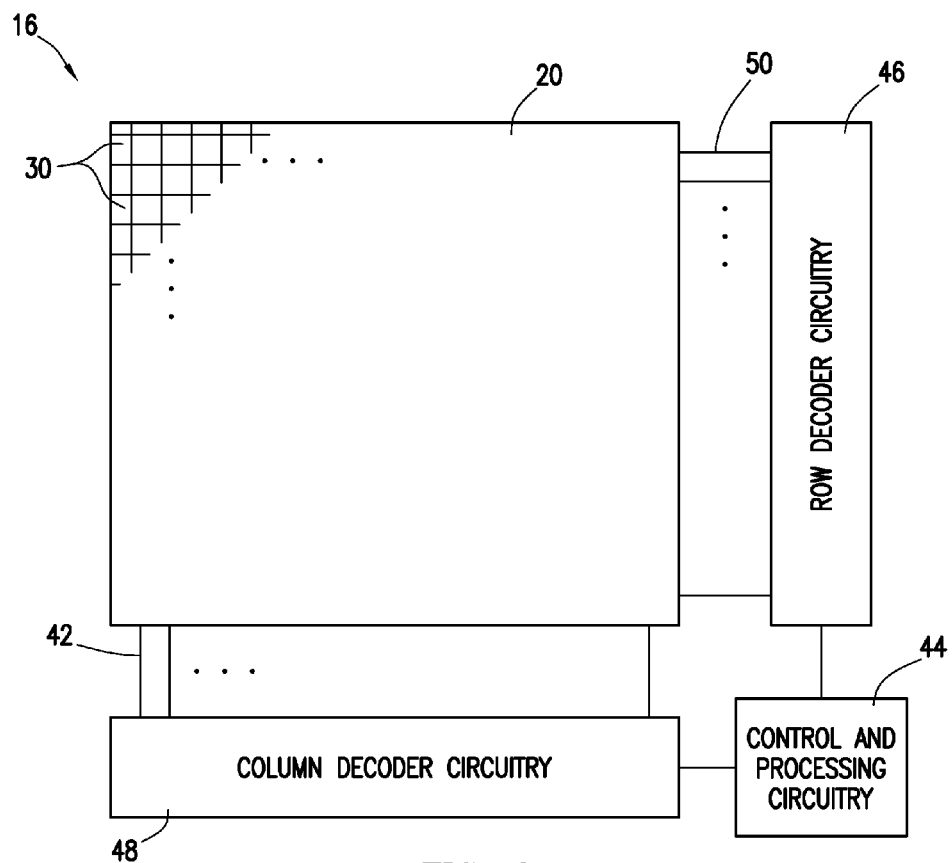
FIG. 2 is a diagram of an illustrative pixel array and associated readout circuitry for reading out image signals from the pixel array in accordance with an embodiment of the present invention.

As shown in FIG. 2, image sensor 16 may include a pixel array 20 containing image sensor pixels 30 arranged in rows and columns (sometimes referred to herein as image pixels or pixels) and control and processing circuitry 44 (which may include, for example, image signal processing circuitry). Array 20 may contain, for example, hundreds or thousands of rows and columns of image sensor pixels 30. Control circuitry 44 may be coupled to row control circuitry 46 and image readout circuitry 48 (sometimes referred to as column control circuitry, readout circuitry, processing circuitry, or column decoder circuitry). Row control circuitry 46 may receive row addresses from control circuitry 44 and supply corresponding row control signals such as reset, row-select, charge transfer, dual conversion gain, and readout control signals to pixels 30 over row control lines 50. One or more conductive lines such as column lines 42 may be coupled to each column of pixels 30 in array 20. Column lines 42 may be used for reading out image signals from pixels 30 and for supplying bias signals (e.g., bias currents or bias voltages) to pixels 30. If desired, during pixel readout operations, a pixel row in array 20 may be selected using row control circuitry 46 and image signals generated by image pixels 30 in that pixel row can be read out along column lines 42.

Image readout circuitry 48 may receive image signals (e.g., analog pixel values generated by pixels 30) over column lines 42. Image readout circuitry 48 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 44 and/or processor 18 (FIG. 1) for pixels in one or more pixel columns.

If desired, a color filter array may be formed over photosensitive regions in array 20 so that a desired color filter element in the color filter array is formed over an upper surface of the photosensitive region of an associated pixel 30. A microlens may be formed over an upper surface of the color filter array to focus incoming light onto the photosensitive region associated with that pixel 30. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 30 in array 20. In another suitable arrangement, an optional masking layer may be interposed between the color filter element and the photosensitive region for one or more pixels 30 in array 20. The masking layers may include metal masking layers or other filtering layers that block a portion of the image light from being received at the photosensitive region. The masking layers may, for example, be provided to some image pixels 30 to adjust the effective exposure level of corresponding image pixels 30 (e.g., image pixels 30 having masking layers may capture less light relative to image pixels 30 without masking layers). If desired, image pixels 30 may be formed without any masking layers.

If desired, pixels 30 in array 20 of FIG. 2 may be provided with an array of color filter elements that each pass one or more colors of light. All or some of pixels 30 may be provided with a color filter element. Color filter elements for pixels 30 may be red color filter elements (e.g., photoresist material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may be configured to filter ultraviolet or infrared light (e.g., a color filter element may only allow infrared light or ultraviolet light to reach the photodiode). Color filter elements may configure image pixel 30 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels and/or broadband pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images. In another suitable example, the green pixels in a Bayer pattern are replaced by broadband image pixels having broadband color filter elements. These examples are merely illustrative and, in general, color filter elements of any desired color and in any desired pattern may be formed over any desired number of image pixels 30.

Figure 3:
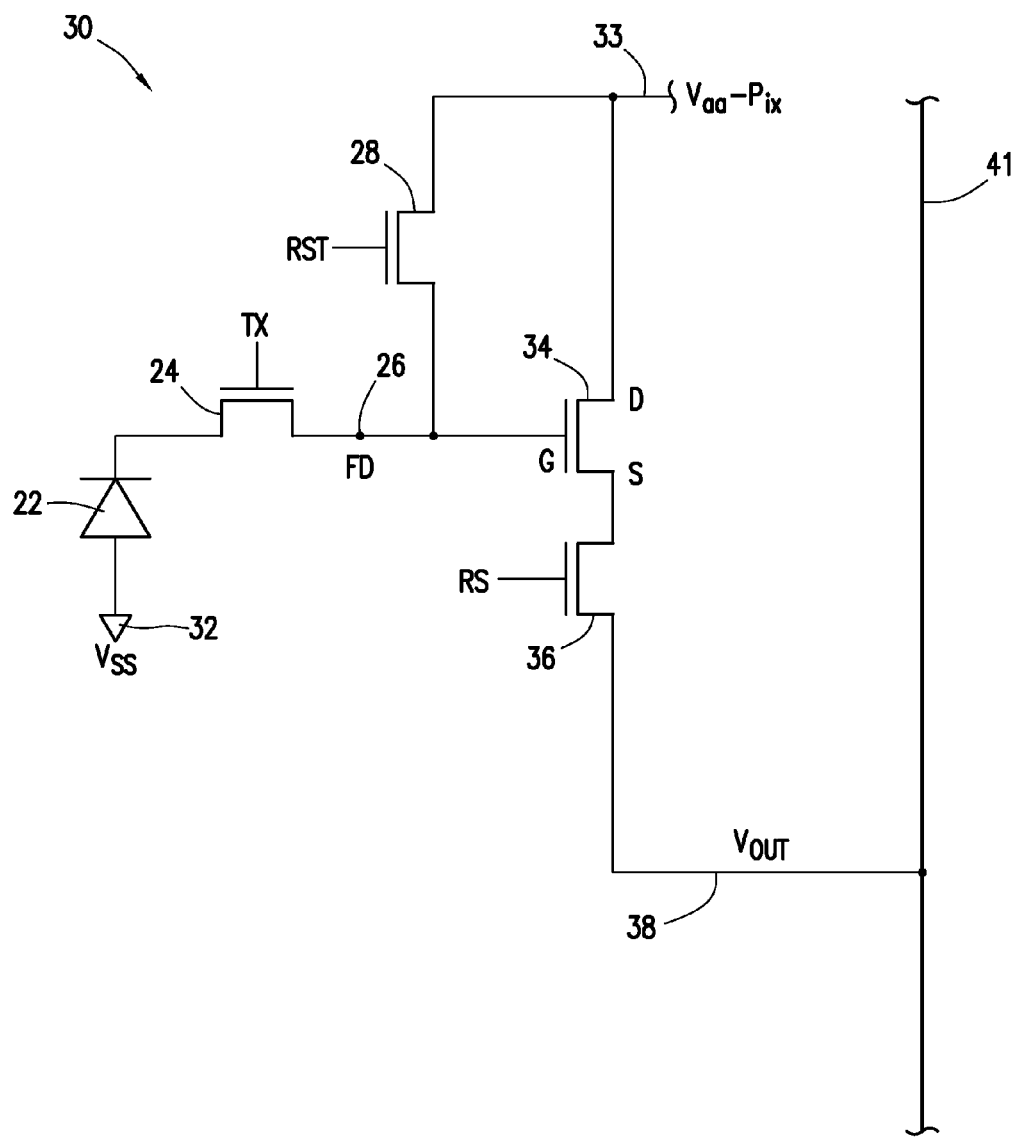
FIG. 3 is a schematic diagram of an illustrative image sensor pixel in accordance with an embodiment of the present invention.

Circuitry in an illustrative image pixel 30 of image pixel array 16 is shown in FIG. 3. As shown in FIG. 3, pixel 30 may include a photosensitive element such as photodiode 22 (sometimes referred to herein as photodetector 22). A positive pixel power supply voltage (e.g., voltage Vaa_pix) may be supplied at positive power supply terminal 33. A ground power supply voltage (e.g., Vss) may be supplied at ground terminal 32. Incoming light is gathered by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to a voltage equal or close to Vaa_pix. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance that can be used to store the charge that has been transferred from photodiode 22. The signal associated with the stored charge on node 26 is buffered by source-follower transistor 34. Row select transistor 36 connects the source follower transistor 34 to column output line 41.

If desired, other types of image pixel circuitry may be used to implement the image pixels of sensors 16. For example, each image sensor pixel 30 (see, e.g., FIG. 1) may be a three-transistor pixel, a pinned-photodiode pixel with four transistors, a global shutter pixel, etc. The circuitry of FIG. 3 is merely illustrative.

When it is desired to read out the value of the stored charge (i.e., the value of the stored charge that is represented by the signal at the source S of transistor 34), select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 30 in the image sensor pixel array of a given image sensor. A conductive path such as path 41 can be associated with one column of image pixels 30.

When signal RS is asserted in a given of pixel 30, path 41 can be used to route signal Vout from the pixel 30 to readout circuitry (48 in FIG. 2).

Figure 4:
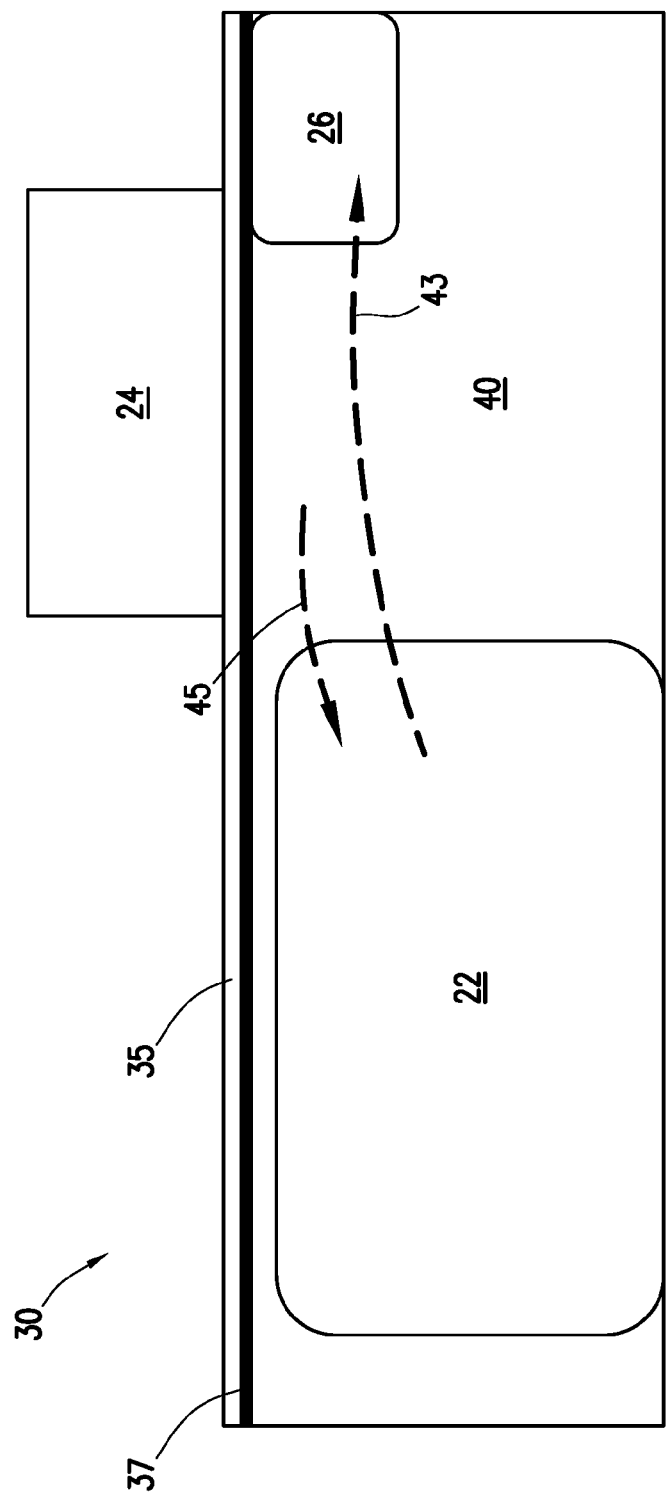
FIG. 4 is a cross-sectional side view of a portion of an illustrative image sensor pixel having a transfer gate that includes a surface channel in accordance with an embodiment of the present invention.

A cross-sectional side view of a portion of pixel 30 of the type described in connection with FIG. 3 is shown in FIG. 4. The pixel 30 of FIG. 4 includes a photodiode 22 and a floating diffusion 26 formed in a semiconductor substrate 40 (e.g., a layer of silicon). A transfer gate 24 transfers charge generated by the photodiode 22 to the floating diffusion 26. Gate oxide 35 (e.g., SiO2) is formed over semiconductor substrate 40. The silicon of semiconductor substrate 40 and gate oxide 35 meet at Si—SiO2 interface 37.

When photodiode 22 is exposed to incident light, charge (electrons) may begin to accumulate in the photodiode well. In some circumstances, more charge may be generated than what the photodiode 22 is capable of holding (e.g., when the pixel 30 is exposed to bright light). In other words, the full well capacity (FWC) of the photodiode may be exceeded. Charge on the photodiode 22 may then "spill" out of the photodiode 22 and into adjacent pixels 30. This overflow of electrons (sometimes referred to herein as blooming or blooming current) may cause undesirable image artifacts in a resulting image.

One way to attempt to mitigate blooming current may include setting the low (off) voltage (Vtx_lo) of transfer gate 24 such that the charge barrier between the photodiode 22 and the floating diffusion 26 (i.e., the antiblooming barrier) is lower than the charge barrier between adjacent photodiodes 30 and from photodiode to pixel transistor source and drain regions (i.e., the isolation barrier). Setting Vtx_lo in this way may allow some or all of the blooming current 43 to flow from photodiode 22 to floating diffusion 26. However, setting Vtx_lo to decrease the charge barrier in this way may allow dark current 45 from the transfer gate 24 to collect in the photodiode 22. Setting Vtx_lo in this way may also prevent the transfer gate 24 from being accumulated and fully turned off. These issues may cause undesirable image artifacts.

Figure 5:
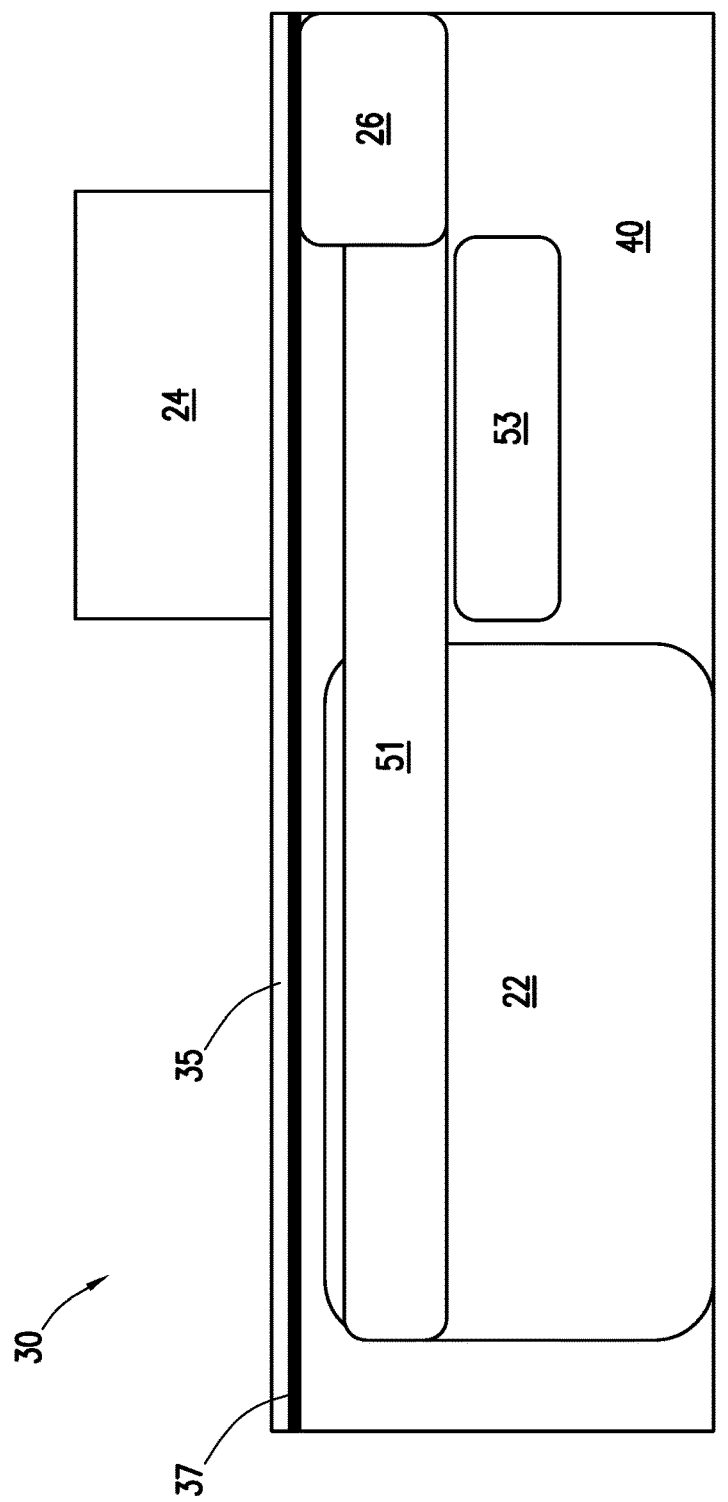
FIG. 5 is a cross-sectional side view of a portion of an illustrative image sensor pixel having a transfer gate with a blanket buried channel in accordance with an embodiment of the present invention.

One way to attempt to resolve these issues may include forming the transfer gate 24 with a blanket buried channel 51. An illustrative example of a pixel 30 that includes a blanket buried channel 51 that extends continuously from the photodiode 22 to the floating diffusion 26 is shown in FIG. 5. Blanket buried channel 51 may include an N-type doped region that confines the transfer of charge to the blanket buried channel 51 so that the charge is kept away from the Si/SiO2 interface 37 of the transfer gate 24. This may help prevent electrons from recombining at the Si/SiO2 interface 37 and may allow accumulating the Si/SiO2 interface 37 to avoid generating dark current 45. A blanket buried channel 51 may also help provide a path for blooming current 43. For example, a large negative voltage can be applied on the transfer gate 24 so that transfer gate 24 can be accumulated and therefore strongly turned off, while the buried channel 51 provides a path from the photodiode 22 to the storage node 26 for blooming charge 43. In some examples, buried P-type implant 53 may be provided below blanket buried channel 51.

A blanket buried channel 51 may, however, have negative effects on pixel performance. For example, for small pixels 30 with a short transfer gate 24, it may be difficult to accumulate transfer gate 24 and establish a path for blooming charge 43 to reach floating diffusion 26 using blanket buried channel 51. To establish a path for blooming charge 43, the buried channel energy and implant dose is not good for the desired photodiode doping and potential profile. One adverse effect of the blanket buried channel implant is an increase the pinning voltage (Vpin) of the photodiode 22, which may in turn increase pixel lag (i.e., lead to less efficient charge transfer from a full photodiode 22 to the floating diffusion 26 when transfer gate 24 is pulsed on) unless a large high voltage (sometimes referred to herein as Vtx on or Vtx hi) is used. While the doping concentration of the photodiode 22 may be reduced in an attempt to reduce the required Vpin in such situations, this will reduce the full well capacity of the photodiode 22. In general, incorporating a blanket buried channel 51 makes it difficult to achieve desirable overall pixel performance.

Figure 6:
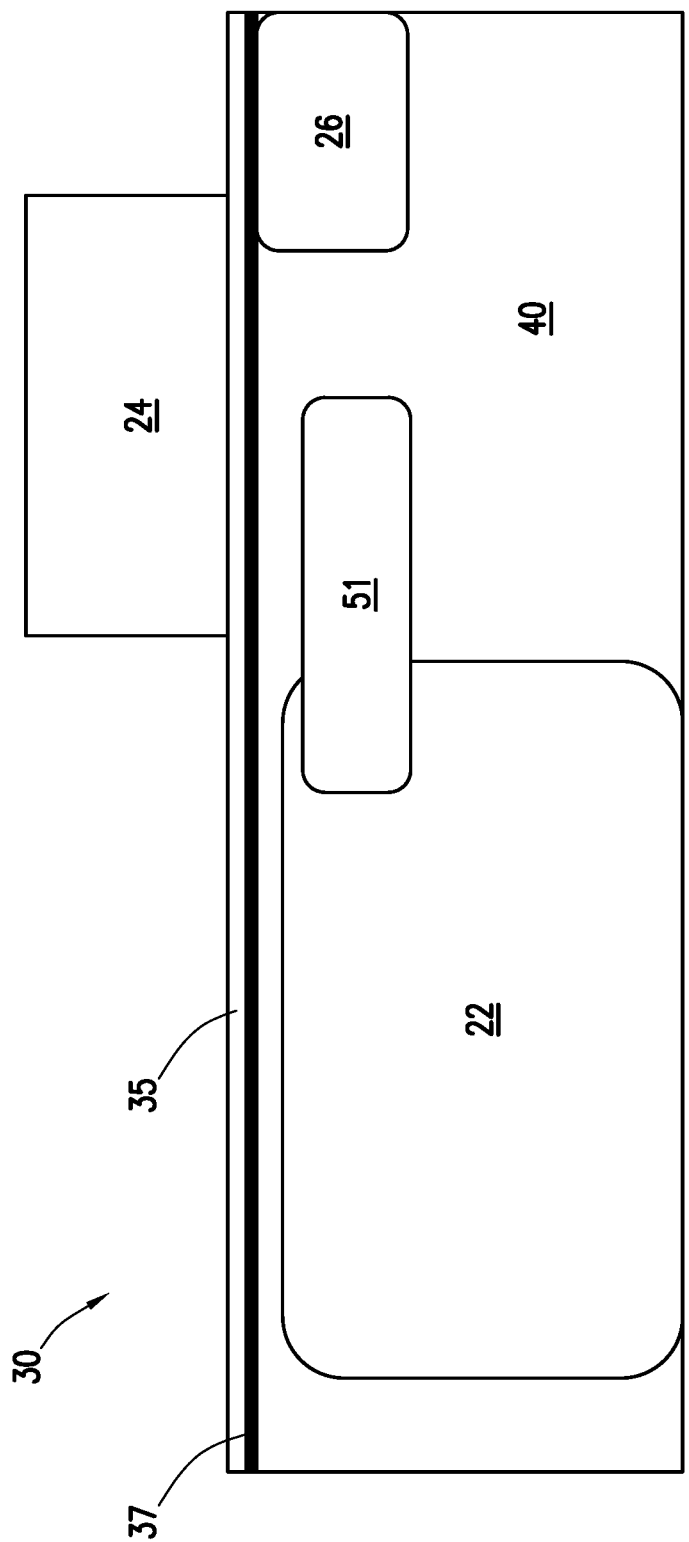
FIG. 6 is a cross-sectional side view of a portion of an illustrative image sensor pixel having a transfer gate with a buried channel that extends from the photodiode in accordance with an embodiment of the present invention.

A partial buried channel 51 that extends from the photodiode 22 as shown in FIG. 6 may be implemented in an attempt to resolve some of the issues that arise when a blanket buried channel 51 is used. However, a partial buried channel 51 of the type shown in FIG. 6 is sensitive to alignment variation, and parameters such as the antiblooming barrier, pinning voltage, and lag may still be affected.

Figure 7:
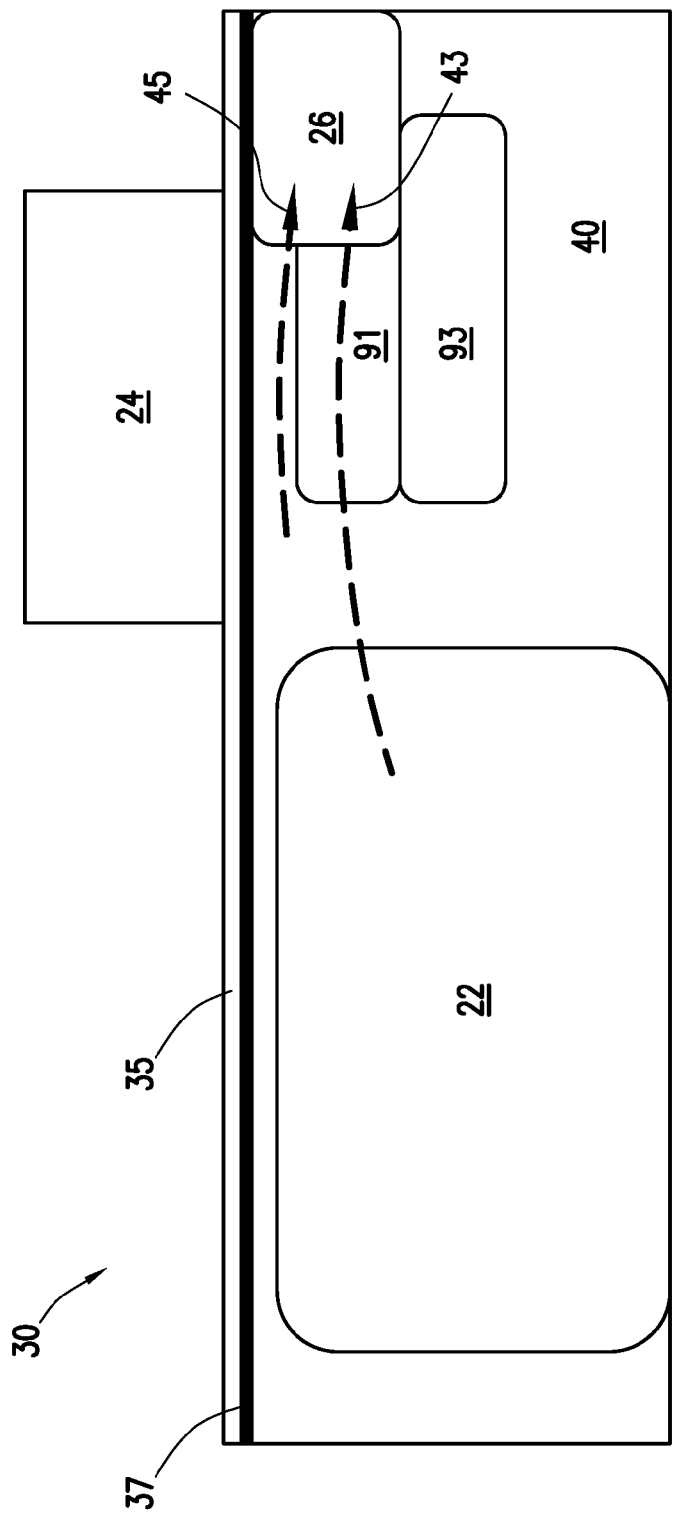
FIG. 7 is a cross-sectional side view of a portion of an illustrative image sensor pixel having a transfer gate with a buried channel that extends from the floating diffusion in accordance with an embodiment of the present invention.

A cross-sectional side view of a portion of an image pixel 30 that may resolve issues with the image sensor pixels 30 described in connection with FIGS. 4-6 is shown in FIG. 7. As shown in FIG. 6, image pixel 30 may include a semiconductor substrate 40, a photodiode 22, a floating diffusion 26, and a transfer gate 24 for transferring charge that accumulates on photodiode 22 to floating diffusion 26. In the illustrative example of FIG. 7, the image sensor pixel 30 may include a buried channel region 91 to form a buried channel transfer gate 24. As shown in FIG. 7, buried channel region (Bch) 91 may extend from (originate from) floating diffusion 26 such that buried channel region 91 is electrically and/or physically coupled to floating diffusion 26. Buried channel region 91 may be formed in semiconductor substrate 40 such that buried channel region 91 extends only partially beneath transfer gate 24. In other words, buried channel region 91 may not extend completely beneath transfer gate 24, may only partially overlap transfer gate 24, may extend into semiconductor substrate 40 and beneath transfer gate 24 without extending to (i.e., reaching or contacting) photodiode 22, and/or may be extend towards photodiode 22 while remaining separated from photodiode 22 by a portion of semiconductor substrate 40 (i.e., there may be a gap between buried channel 91 and photodiode 22). In this way, buried channel 91 may be referred to as a discontinuous buried channel, may be said to not extend the entire length of transfer gate 24, and/or may be said to be confined to a central region of the transfer gate 24.

In one suitable arrangement, buried channel 91 is an N-type channel. If desired, the buried channel transfer gate 24 may also include a buried P-type implant (BTP) 93 formed beneath the buried channel region 91. Buried P-type implant 93 may overlap buried channel 91 and may also extend only partially beneath transfer gate 24. Buried P-type implant 93 may confine buried channel 91 to a narrower, thinner region within semiconductor substrate 40, which may help confine and control the potential of the region in pixel 30 through which blooming current 43 flows. This, however, is merely illustrative. If desired, the doping types of the implant 93 and the buried channel 91 may be reversed.

In one example, arsenic can be used as the dopant for the buried channel region 91 and boron can be used as the dopant for the P-type implant 93. This, however, is merely illustrative, and different dopants may be used if desired.

By forming buried channel region 91 that extends from the floating diffusion 26 without extending in to the photodiode 22, negative aspects associated with pixels of the types shown in FIGS. 4-6 may be mitigated. For example, the buried channel region 91 of FIG. 7 may be implemented without having to adjust the photodiode potential or the doping profile of photodiode 22, which is required with a buried channel 51 of the type shown in FIGS. 5 and 6. Thus, existing photodiode and transfer gate engineering may be implemented to provide low lag and low dark current. The photodiode side of the transfer gate 24 is also easily accumulated when a buried channel 91 is implemented as shown in FIG. 7, and can provide steering of dark current 45 from the transfer gate 24 to the floating diffusion 26, rather than into photodiode 22. Buried channel region 91 may also provide a path for blooming current 43 to be directed from photodiode 22 to floating diffusion 26 without having to reduce the doping concentration of photodiode 22 (and thereby avoiding decreases in the full well capacity of the photodiode 22). In such an arrangement, Vtx_lo may still be adjusted to provide some control of the blooming barrier and the flow of blooming current to floating diffusion 26.

With a buried channel 91 of the type shown and described in connection with FIG. 7, Vtx_lo can be set at −1.0V (for example) to suppress dark current 45 from the transfer gate 24 and the Si/SiO2 interface 37. The antiblooming barrier may be set by buried channel region 91, which is below the surface region under transfer gate 24. As a result, an antiblooming barrier that is 0.2V to 0.3V lower than the isolation barrier may be provided, allowing for both a high current antiblooming path and surface accumulation of the transfer gate channel region proximal to the photodiode. A buried transfer P-type implant 93 may confine the buried channel region 91 to a narrower portion below the surface of transfer gate 24 to improve control of the antiblooming barrier potential and flow of antiblooming current. This avoids issues (e.g., those described above in connection with FIG. 4) that may be introduced when Vtx_lo is set less negative than the Vtx_lo required to suppress TX dark current in order to provide an antiblooming barrier that is 0.2V to 0.3V lower than the isolation barrier, (i.e. the barrier between adjacent photodiodes and from photodiode to pixel transistor source and drain regions).

When buried channel implant 91 (e.g. an N-type implant) is confined to the floating diffusion side of the transfer gate 24, the buried channel implant 91 can be used to set the threshold voltage of the floating diffusion side of the transfer gate 24 to be lower than the photodiode side of the transfer gate. In other words, a P-type region under the photodiode side of transfer gate 24 will have a higher threshold voltage than the region under the floating diffusion side of the transfer gate 24 without having to add an extra P-type implant with to the photodiode side of the transfer gate 24 in order to create the higher threshold voltage (which may be required in the examples of FIGS. 4-6). As a result of the lower threshold voltage on the floating diffusion side of the transfer gate 24, any transfer gate dark current 45 will be steered to the floating diffusion 26 during integration and not be collected in the photodiode 22. Accordingly, the extra P-type implant for the photodiode side of the transfer gate 24 implant can be eliminated and dark current steering can be achieved with the new buried channel structure 91. Because the extra P-type implant may be eliminated, the additional mask required for the buried channel 91 can be used without a net increase in the number of masks.

Figure 8:
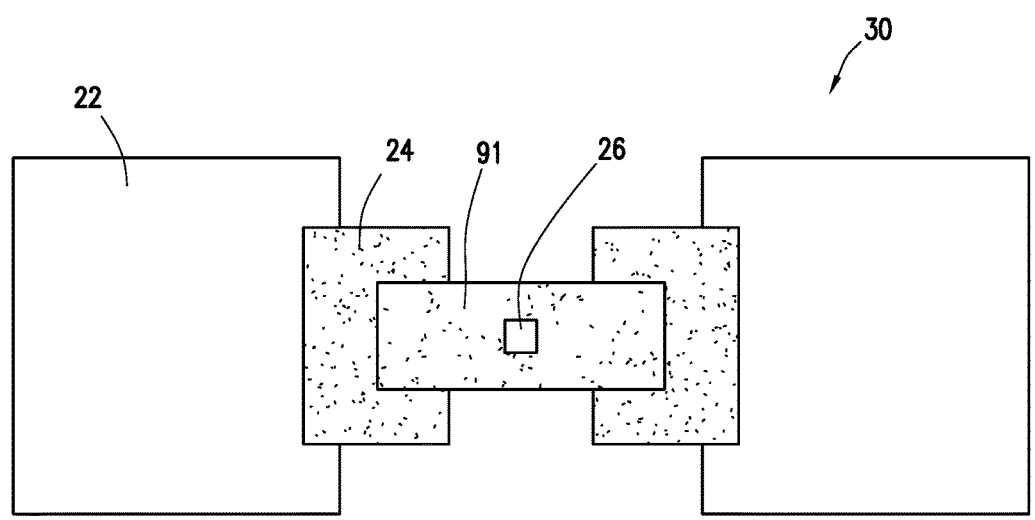
FIG. 8 is a plan view of illustrative a portion of image sensor pixels having transfer gates with buried channels that extend from a floating diffusion in accordance with an embodiment of the present invention.

A top-down plan view of a portion of image sensor 16 is shown in FIG. 8. FIG. 8 shows a portion of a plurality of pixels 30 (only one of which is labeled) having photodiode 22 and transfer gate 24. In the illustrative example of FIG.

8, floating diffusion 26 is shared between two pixels 30. This is merely illustrative, as each pixel 30 may have its own floating diffusion 26 or more than two pixels 30 may share a floating diffusion 26, if desired.

As shown in FIG. 8, buried channel 91 is confined to the central region of transfer gate 24. During manufacturing, the buried P-type implant 93 may be formed using the same layout and mask as the buried channel 91 such that buried channel 91 and P-type implant 93 are aligned (i.e., P-type implant 93 is also confined to a central region of the transfer gate 24). By forming buried channel 91 and P-type implant 93 using the same layout and mask, a fabrication process with reduced mask set cost, reduced mask steps, and lower overall process cost may be provided. Forming buried channel 91 and P-type implant 93 in this way may also minimize or eliminate alignment issues between buried channel 91 and P-type implant 93. By confining channel 91 and implant 93 to a central region of the transfer gate 24, the layout is less sensitive to alignment variation with transfer gate 24. This arrangement may also reduce dark current 45 and increase conversion gain. For example, alignment variation may only affect the distance between the photodiode 22 and buried channel 91, and may not affect Vpin. This may provide less variation in the antiblooming barrier and current.

If desired, the buried channel implant 91 and P-type implant 93 can be formed using the same mask used for the N-type lightly doped drain (NLDD) implant. In another example, a separate mask may be used for buried channel 91 and the implant 93 so that the P-type implant 93 can be omitted from the floating diffusion region 26 to provide a higher conversion gain (i.e., reduce floating diffusion capacitance). In yet another example, the P-type implant 93 may be omitted entirely.

Figure 9:
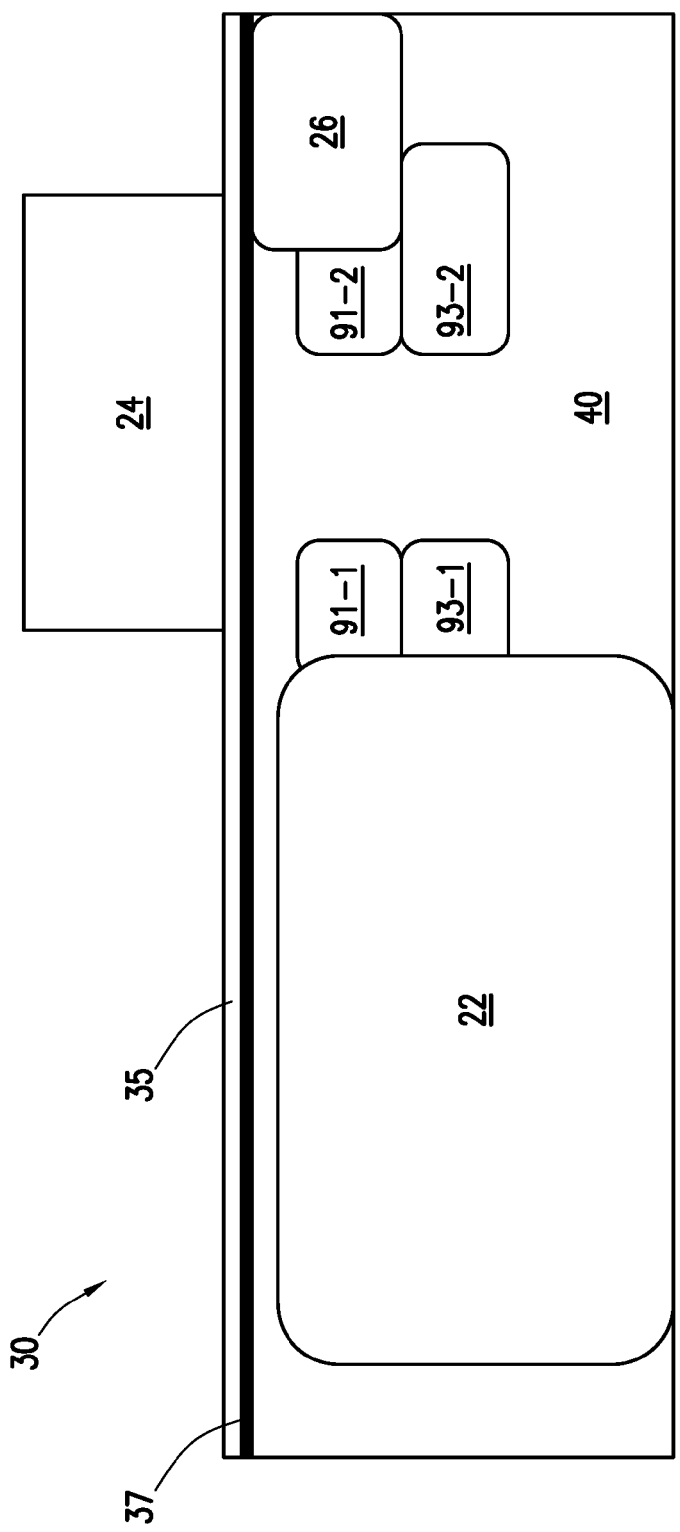
FIG. 9 is a cross-sectional side view of a portion of an illustrative image sensor pixel having a transfer gate with a first buried channel portion that that extends from the floating diffusion and a second buried channel portion that extends from the photodiode in accordance with an embodiment of the present invention.

Other arrangements for buried channel 91 and/or P-type implant 93 are also possible. For example, FIG. 9 shows a partial buried channel 91 that is implemented by having a first buried channel portion (region) 91-1 extend from the photodiode 22 and a second buried channel portion (region) 91-2 extend from the floating diffusion 26. A gap between portion 91-1 and portion 91-2 is present in the central region of transfer gate 24. The P-type implant 93 may have a first portion 93-1 and a second portion 93-2 that correspond to the first and second buried channel portions 91-1 and 91-2. In this example, the antiblooming barrier may be controlled by the size of the gap between buried channel region 91-1 and buried channel region 91-2. With this approach, the antiblooming barrier is not sensitive to normal alignment variation between the buried channel 91 relative to transfer gate 24, photodiode 22, and floating diffusion 26. In this example, the buried channel 91 may have less effect on photodiode potential than a blanket buried channel (P-type implant 93 may compensate for pinning voltage increase). Similar to the layout described in connection with FIGS. 7 and 8, the same mask for buried channel 91 and P-type implant 93 may be used, reducing alignment issues between buried channel 91 and P-type implant 93, and reducing variation in blooming barrier and current due to alignment variation. The P-type implant 93 may be omitted in the floating diffusion region to lower floating diffusion capacitance.

Figure 10:
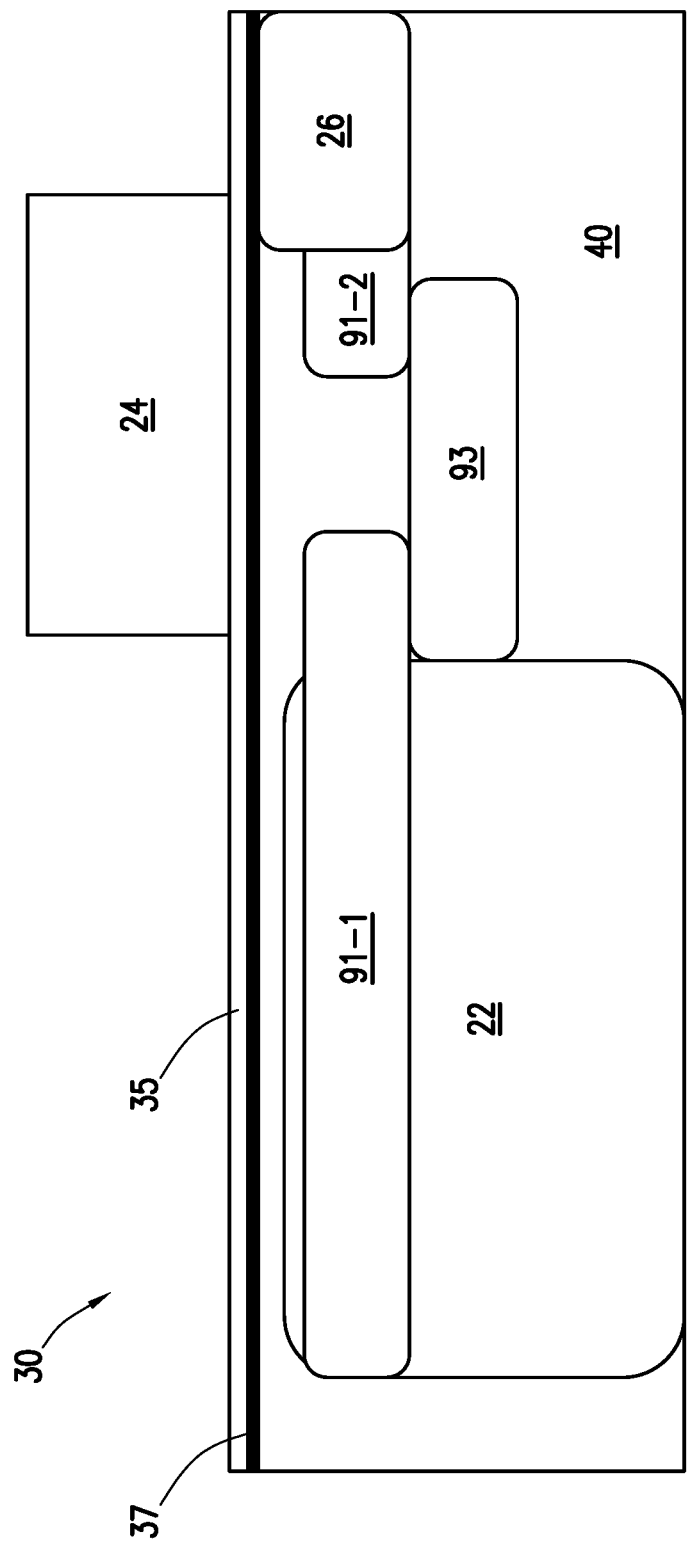
FIG. 10 is a cross-sectional side view of a portion of an illustrative image sensor pixel having a transfer gate with a first buried channel portion that that extends from the floating diffusion and a second buried channel portion that extends through the photodiode in accordance with an embodiment of the present invention.

In FIG. 10, a partial buried channel 91 is implemented by overlapping the entire photodiode 22 (or at least more of the photodiode 22 than shown in FIG. 9) with a first buried channel region 91-1 and providing a second buried channel region 91-2 that extends from the floating diffusion 26. A gap is still maintained under the transfer gate 24 between the two buried channel regions 91-1 and 91-2. An arrangement such as this may be particularly useful in pixels 30 that include a very short transfer gate 24 and small photodiode 22 and where the first channel portion 91-1 may be too small to pattern easily (e.g., when patterning may be difficult if channel portion 91-1 extended only a short distance into photodiode 22). By creating a blanket channel portion 91-1 that extends farther into the photodiode 22, the gap between first and second buried channel regions 91-1 and 91-2 can be created by the buried channel mask. Alternatively, the buried channel gap may be created using another buried channel compensating mask and an opposite doping type implant. For example, if buried channel 91 is N-type, the compensating implant is P-type. That is, the buried channel mask can be used to create an N-type buried channel traversing a larger transfer gate region or the entire length of transfer gate region 24, and a P-type buried channel compensation mask and implant can be used to define where the buried channel region 91 is removed (i.e., the gap between channel portions 91-1 and 91-2 in FIG. 10). Other methods of forming a discontinuous buried channel 91 may be used. The P-type implant 93 may overlap portions of the first and second buried channel regions 91-1 and 91-2, as well as the gap between the portions. The buried P-type implant may also be omitted from the floating diffusion region 26, for example, to lower floating diffusion capacitance.

Figure 11:
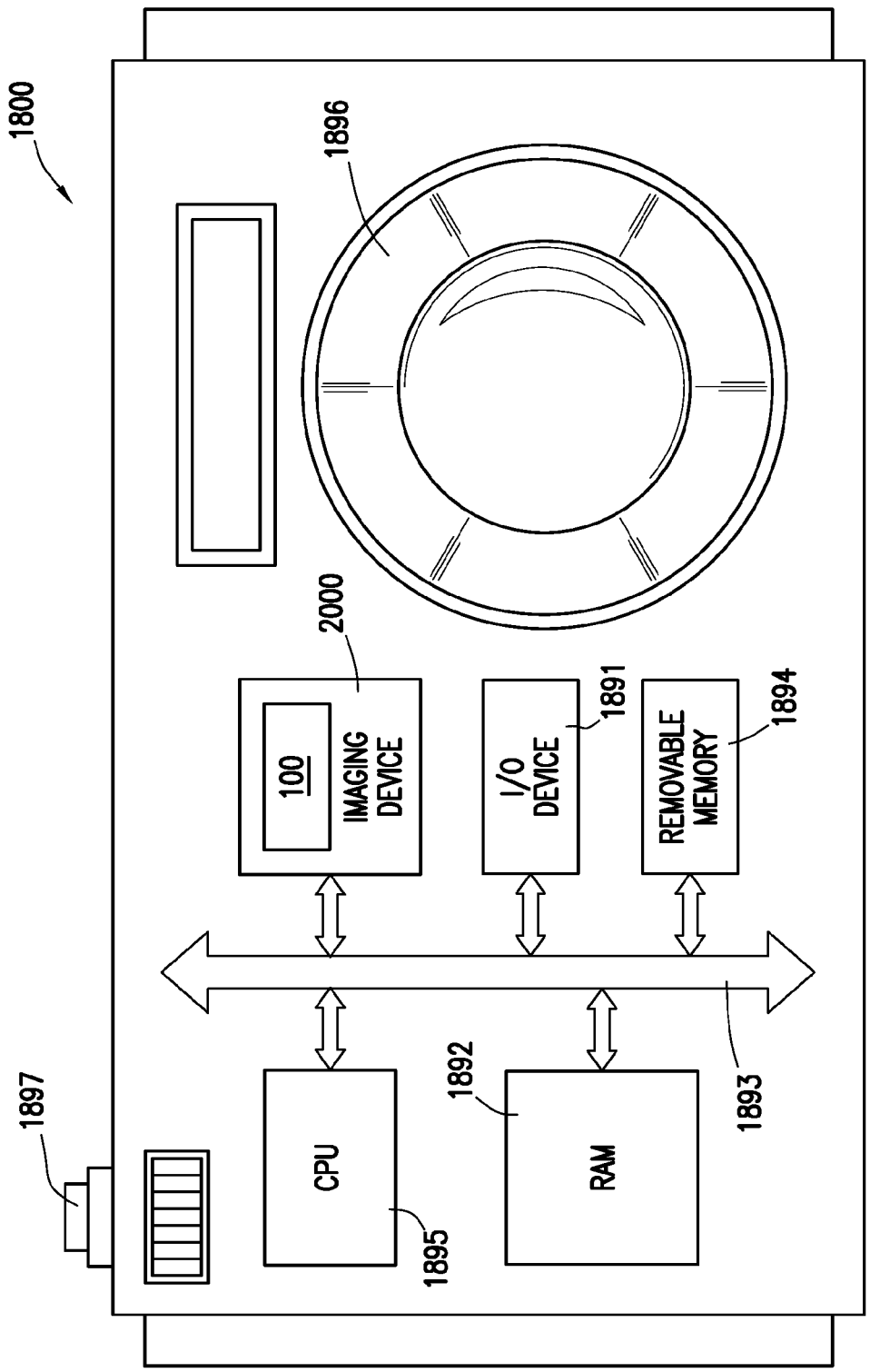
FIG. 11 is a block diagram of an illustrative image capture and processor system employing the embodiments of FIGS. 1-10 in accordance with an embodiment of the present invention.

FIG. 11 shows in simplified form a typical image capture and processor system 1800, such as a digital camera, which includes an imaging device 2000 (e.g., an imaging device 2000 such as image sensor 16 of FIGS. 1-10 employing pixels 30 having buried channel(s) 91). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The image capture and processor system 1800 generally includes a lens 1896 for focusing an image on pixel array 20 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

In various embodiments, an image sensor pixel formed on a semiconductor substrate may include a photodetector that generates charge in response to incident light, a floating diffusion, a transfer gate that transfers the charge generated by the photodetector to the floating diffusion, and a buried channel region formed in the semiconductor substrate. The buried channel region may be coupled to and extend from the floating diffusion. The buried channel region may only partially overlap the transfer gate. The buried channel region may extend only partially beneath the transfer gate and may not extend to the photodetector. A portion of the semiconductor substrate may separate the buried channel region from the photodetector. A first portion of the transfer gate may overlap the buried channel region, and a second portion of the transfer gate may not overlap the buried channel region.

At least some of the charge generated by the photodetector may include blooming current, and the buried channel region may be configured to couple the blooming current from the photodetector to the floating diffusion without turning on the transfer gate. The buried channel region may couple the blooming current from the photodetector to the floating diffusion without coupling dark current from the transfer gate into the photodetector.

A buried P-type implant may be formed in the semiconductor substrate beneath the buried channel region. The buried channel region may include first and second buried channel region portions separated by a gap. The first buried channel region portion may extend from the photodetector and only partially overlap the transfer gate, and the second buried channel region portion may extend from the floating diffusion and only partially overlap the transfer gate. First and second buried P-type implants may be formed in the semiconductor substrate beneath the first and second buried channel region portions, and the first and second buried P-type implants may be separated by the gap. The first buried channel region portion extend may extend completely through the photodetector. A buried P-type implant may be formed in the semiconductor substrate beneath the first and second buried channel region portions, and the buried P-type implant may extend beneath the gap.

In various embodiments, a pixel may include a photodetector, a floating diffusion, and a transfer gate. The transfer gate may include a discontinuous buried channel. The discontinuous buried channel may overlap a central region of the transfer gate without extending to the photodetector. The discontinuous buried channel may extend from the floating diffusion to the central region of the transfer gate. The discontinuous buried channel may include a first portion that extends from the floating diffusion toward the photodetector and a second portion that extends from the photodetector toward the floating diffusion. The first and second portions may not touch. The transfer gate may include a buried implant beneath the discontinuous buried channel. The discontinuous buried channel may have a first doping type, and the buried implant may have a second doping type that is different than the first doping type.

In various embodiments, a system may include a central processing unit, memory, input-output circuitry, and an image sensor. The image sensor may include an array of pixels. At least one of the pixels in the array may include a photodetector that generates charge in response to light, a floating diffusion, a transfer gate that opens to transfer a first portion of the generated charge to the floating diffusion, and a buried channel region that extends from the floating diffusion. The buried channel region may extend beneath a central portion of the transfer gate without extending to the photodetector. The buried channel region may transfer a second portion of the generated charge to the floating diffusion without opening the transfer gate. A buried P-type implant may overlap the buried channel region without extending to the photodetector. The at least one of the pixels in the array may be one of a plurality of adjacent pixels, and each of the plurality of adjacent pixels may share the buried channel region. The buried channel region may include first and second portions separated by a gap.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel formed on a semiconductor substrate, the image sensor pixel comprising:
   a photodetector that generates charge in response to incident light;
   a floating diffusion;
   a transfer gate that transfers the charge generated by the photodetector to the floating diffusion; and
   a buried channel region formed in the semiconductor substrate, wherein the buried channel region is coupled to and extends from the floating diffusion, wherein the buried channel region only partially overlaps the transfer gate, wherein the buried channel region comprises first and second buried channel region portions separated by a gap, wherein the first buried channel region portion extends from the photodetector and only partially overlaps the transfer gate, and wherein the second buried channel region portion extends from the floating diffusion and only partially overlaps the transfer gate.

2. The image sensor pixel defined in claim 1, wherein the second buried channel region portion extends only partially beneath the transfer gate and does not extend to the photodetector.

3. The image sensor pixel defined in claim 2, wherein a portion of the semiconductor substrate in the gap separates the first buried channel region portion from the second buried channel region portion.

4. The image sensor pixel defined in claim 1, wherein a first portion of the transfer gate overlaps the first buried channel region portion, and wherein a second portion of the transfer gate does not overlap the first buried channel region portion.

5. The image sensor pixel defined in claim 1, wherein at least some of the generated charge comprises blooming current, and wherein the buried channel region is configured to couple the blooming current from the photodetector to the floating diffusion without turning on the transfer gate.

6. The image sensor pixel defined in claim 5, wherein the buried channel region couples the blooming current from the photodetector to the floating diffusion without coupling dark current from the transfer gate into the photodetector.

7. The image sensor pixel defined in claim 1, further comprising:
   a buried P-type implant formed in the semiconductor substrate beneath the buried channel region.

8. The image sensor pixel defined in claim 1, further comprising:
   first and second buried P-type implants formed in the semiconductor substrate beneath the first and second buried channel region portions, wherein the first and second buried P-type implants are separated by the gap.

9. The image sensor pixel defined in claim 1, wherein the first buried channel region portion extends completely through the photodetector.

10. The image sensor pixel defined in claim 9, further comprising:
    a buried P-type implant formed in the semiconductor substrate beneath the first and second buried channel region portions, wherein the buried P-type implant extends beneath the gap.

* * * * *